(12) United States Patent
Fukunaga et al.

(10) Patent No.: US 8,143,635 B2
(45) Date of Patent: Mar. 27, 2012

(54) GALLIUM NITRIDE COMPOUND SEMICONDUCTOR LIGHT-EMITTING DEVICE, METHOD OF MANUFACTURING THE SAME, AND LAMP INCLUDING THE SAME

(75) Inventors: Naoki Fukunaga, Munakata (JP); Hiroshi Osawa, Chiba (JP)

(73) Assignee: Showa Denko K.K., Tokyo (JP)

( * ) Notice: Subject to any disclaimer, the term of this patent is extended or adjusted under 35 U.S.C. 154(b) by 291 days.

(21) Appl. No.: 12/293,680

(22) PCT Filed: Mar. 23, 2007

(86) PCT No.: PCT/JP2007/055988
§ 371 (c)(1), (2), (4) Date: Sep. 19, 2008

(87) PCT Pub. No.: WO2007/108531
PCT Pub. Date: Sep. 27, 2007

(65) Prior Publication Data
US 2010/0163886 A1 Jul. 1, 2010

(30) Foreign Application Priority Data
Mar. 23, 2006 (JP) ................................. 2006-080882

(51) Int. Cl.
*H01L 33/00* (2010.01)
*H01L 21/00* (2006.01)
(52) U.S. Cl. ...................... 257/98; 257/E33.064; 438/46
(58) Field of Classification Search .................... 257/76, 257/99, 706, E33.064, E33.025, 79, 98, 103; 438/4, 459, 506, 16, 22, 29, 46
See application file for complete search history.

(56) References Cited

U.S. PATENT DOCUMENTS

| | | | |
|---|---|---|---|
| 5,306,662 A | | 4/1994 | Nakamura et al. |
| 5,677,240 A | * | 10/1997 | Murakami et al. ............. 438/609 |
| 5,767,581 A | * | 6/1998 | Nakamura et al. ............. 257/749 |
| 6,130,103 A | * | 10/2000 | Cuchiaro et al. ................... 438/3 |
| 2005/0104080 A1 | * | 5/2005 | Ichihara et al. .................. 257/98 |
| 2006/0273333 A1 | * | 12/2006 | Wu et al. .......................... 257/94 |

FOREIGN PATENT DOCUMENTS

| JP | 62-22312 A | 1/1987 |
|---|---|---|
| JP | 6-88973 A | 3/1994 |
| JP | 2540791 B2 | 7/1996 |
| JP | 2004-342618 A | 12/2004 |
| JP | 2005-209733 A | 8/2005 |
| JP | 2005-217331 A | 8/2005 |
| JP | 2005-244128 A | 9/2005 |
| JP | 2005-244129 A | 9/2005 |

* cited by examiner

*Primary Examiner* — Thomas L Dickey
*Assistant Examiner* — Nikolay Yushin
(74) *Attorney, Agent, or Firm* — Sughrue Mion, PLLC

(57) ABSTRACT

The present invention provides a gallium nitride compound semiconductor light-emitting device that prevents an increase in the specific resistance of a p-type semiconductor layer due to hydrogen annealing and reduces the specific resistance of a translucent conductive oxide film to lower a driving voltage Vf, a method of manufacturing the same, and a lamp including the same. The method of manufacturing the gallium nitride compound semiconductor light-emitting device includes: forming a positive electrode 15 composed of a translucent conductive oxide film on a p-type GaN layer 14 of a gallium nitride compound semiconductor device; and a hydrogen annealing process of annealing the positive electrode 15 in a gas atmosphere including hydrogen ($H_2$).

16 Claims, 3 Drawing Sheets

GALLIUM NITRIDE COMPOUND SEMICONDUCTOR LIGHT-EMITTING DEVICE, METHOD OF MANUFACTURING THE SAME, AND LAMP INCLUDING THE SAME

TECHNICAL FIELD

The present invention relates to a gallium nitride compound semiconductor light-emitting device, and more particularly, to a gallium nitride compound semiconductor light-emitting device having a low driving voltage Vf, a method of manufacturing the same, and a lamp including the same.

Priority is claimed on Japanese Patent Application No. 2006-080882, filed Mar. 23, 2006, the content of which is incorporated herein by reference.

BACKGROUND ART

In recent years, GaN compound semiconductor materials, which are nitride semiconductors, have drawn attention as semiconductor materials for short wavelength light-emitting devices. The GaN compound semiconductor is formed on various kinds of substrates, such as a sapphire single crystal substrate, an oxide substrate, and a III-V group compound substrate, by a metal organic chemical vapor deposition (MOCVD) method or a molecular beam epitaxy (MBE) method.

The gallium nitride compound semiconductor device is characterized in that a small amount of current is diffused in the horizontal direction. Therefore, a current is applied to only a semiconductor immediately below an electrode, and light emitted from a light-emitting layer is shielded by the electrode, which makes it difficult to emit light from the light-emitting device to the outside. In addition, in the light-emitting device, a translucent positive electrode is generally used, and light is emitted to the outside through the translucent positive electrode.

The translucent positive electrode is formed of a known conductive material, such as Ni/Au or ITO. However, metallic materials, such as Ni/Au, have a low contact resistance with a p-type semiconductor layer, but have a low light transmittance. On the other hand, oxides, such as ITO, have a high light transmittance, but have a high contact resistance.

A method of performing annealing in a nitrogen ($N_2$) or hydrogen atmosphere has been proposed in order to reduce the specific resistance of a conductive oxide film, such as an ITO film. The annealing process increases oxygen vacancies in the conductive oxide film and the carrier density of the conductive oxide film. The increase in the carrier density causes the specific resistance of the conductive oxide film to be reduced. In general, the reduction action of the oxide film is stronger in a gas atmosphere including hydrogen than in a gas atmosphere including nitrogen. Therefore, when the annealing process is performed in a gas atmosphere including hydrogen, it is possible to obtain a conductive oxide film having low specific resistance.

However, in the annealing process performed in the gas atmosphere including hydrogen, hydrogen is bonded to Mg or Zn doped into a p-type semiconductor layer of a gallium nitride compound semiconductor light-emitting device, and hinders impurities, such as Mg or Zn, from serving as acceptors. The bonding between the acceptor impurities and hydrogen causes an increase in the specific resistance of the p-type semiconductor layer.

[Patent Document 1] JP-A-6-88973
[Patent Document 2] Japanese Patent No. 2540791

DISCLOSURE OF THE INVENTION

Problem that the Invention is to Solve

The present invention has been made in order to solve the above problems, and an object of the invention is to provide a gallium nitride compound semiconductor light-emitting device that prevents an increase in the specific resistance of a p-type semiconductor layer due to hydrogen annealing and reduces the specific resistance of a translucent conductive oxide film to lower a driving voltage Vf, a method of manufacturing the same, and a lamp including the same.

Means for Solving the Problems

The inventors have conceived the present invention in order to solve the above problems.

That is, the present invention is as follows.

According to a first aspect of the present invention, there is provided a method of manufacturing a gallium nitride compound semiconductor light-emitting device in which a translucent conductive oxide film is formed on a p-type semiconductor layer of a gallium nitride compound semiconductor device. The method includes: after the translucent conductive oxide film is formed on the p-type semiconductor layer, a hydrogen annealing process of annealing the film in a gas atmosphere including hydrogen ($H_2$).

According to a second aspect of the present invention, preferably, the method of manufacturing a gallium nitride compound semiconductor light-emitting device according to the first aspect further includes: (a) a process of forming the translucent conductive oxide film on the entire surface of the p-type semiconductor layer; (b) a hydrogen annealing process of annealing the translucent conductive oxide film in a gas atmosphere including hydrogen; and (c) an etching process of etching the translucent conductive oxide film to pattern the translucent conductive oxide film.

According to a third aspect of the present invention, in the method of manufacturing a gallium nitride compound semiconductor light-emitting device according to the first or second aspect, preferably, the hydrogen annealing process is performed at a temperature in the range of 300° C. to 900° C.

According to a fourth aspect of the present invention, preferably, the method of manufacturing a gallium nitride compound semiconductor light-emitting device according to the first aspect further includes: (d) a process of forming the translucent conductive oxide film on the entire surface of the p-type semiconductor layer; (e) an etching process of etching the translucent conductive oxide film to pattern the translucent conductive oxide film; and (f) a hydrogen annealing process of annealing the translucent conductive oxide film in a gas atmosphere including hydrogen.

According to a fifth aspect of the present invention, in the method of manufacturing a gallium nitride compound semiconductor light-emitting device according to the fourth aspect, preferably, the hydrogen annealing process is performed at a temperature in the range of 600° C. to 900° C.

According to a sixth aspect of the present invention, in the method of manufacturing a gallium nitride compound semiconductor light-emitting device according to any one of the first to fifth aspects, preferably, the hydrogen annealing process is performed in a gas atmosphere including 0.1 to 5% by volume of hydrogen.

According to a seventh aspect of the present invention, preferably, the method of manufacturing a gallium nitride compound semiconductor light-emitting device according to any one of the first to sixth aspects further includes: before the hydrogen annealing process, an oxygen annealing process of performing annealing at a temperature in the range of 200° C. to 300° C. in a gas atmosphere including oxygen ($O_2$).

According to an eighth aspect of the present invention, in the method of manufacturing a gallium nitride compound semiconductor light-emitting device according to any one of the first to seventh aspects, preferably, after the hydrogen annealing process, a protective layer is formed on the translucent conductive oxide film.

According to a ninth aspect of the present invention, a gallium nitride compound semiconductor light-emitting device includes: a gallium nitride compound semiconductor device including a p-type semiconductor layer; and a translucent conductive oxide film that is formed on the p-type semiconductor layer. An annealing process is performed on the translucent conductive oxide film in a gas atmosphere including hydrogen ($H_2$).

According to a tenth aspect of the present invention, in the gallium nitride compound semiconductor light-emitting device according to the ninth aspect, preferably, the translucent conductive oxide film is formed of at least one of ITO, IZO, IWO, GZO, ZnO, and $TiO_2$.

According to an eleventh aspect of the present invention, in the gallium nitride compound semiconductor light-emitting device according to the tenth aspect, preferably, the translucent conductive oxide film includes at least ITO.

According to a twelfth aspect of the present invention, in the gallium nitride compound semiconductor light-emitting device according to any one of the ninth to eleventh aspects, preferably, the thickness of the translucent conductive oxide film is in the range of 35 nm to 10 μm.

According to a thirteenth aspect of the present invention, in the gallium nitride compound semiconductor light-emitting device according to any one of the ninth to eleventh aspects, preferably, the thickness of the translucent conductive oxide film is in the range of 100 nm to 1 μm.

According to a fourteenth aspect of the present invention, in the gallium nitride compound semiconductor light-emitting device according to any one of the ninth to thirteenth aspects, preferably, a protective layer is formed on the translucent conductive oxide film.

According to a fifteenth aspect of the present invention, in the gallium nitride compound semiconductor light-emitting device according to the fourteenth aspect, preferably, the thickness of the protective layer is in the range of 20 nm to 500 nm.

According to a sixteenth aspect of the present invention, a gallium nitride compound semiconductor light-emitting device is manufactured by the method according to any one of the first to eighth aspects.

According to a seventeenth aspect of the present invention, a lamp includes the gallium nitride compound semiconductor light-emitting device according to any one of the ninth to sixteenth aspects.

Advantages of the Invention

According to a method of manufacturing a gallium nitride compound semiconductor light-emitting device of the present invention, after a translucent conductive oxide film is formed on the p-type semiconductor layer, an annealing process is performed on the translucent conductive oxide film in a gas atmosphere including hydrogen. According to this structure, it is possible to obtain a translucent conductive oxide film having low specific resistance and prevent an increase in the specific resistance of the p-type semiconductor layer. In this way, it is possible to obtain a gallium nitride compound semiconductor light-emitting device having a low driving voltage Vf.

In addition, when the gallium nitride compound semiconductor light-emitting device according to the present invention is used for a lamp, it is possible to obtain a lamp having high emission characteristics.

BRIEF DESCRIPTION OF THE DRAWINGS

FIG. 6 shows the driving voltages Vf in Examples 1 and 2.

Figure 1:
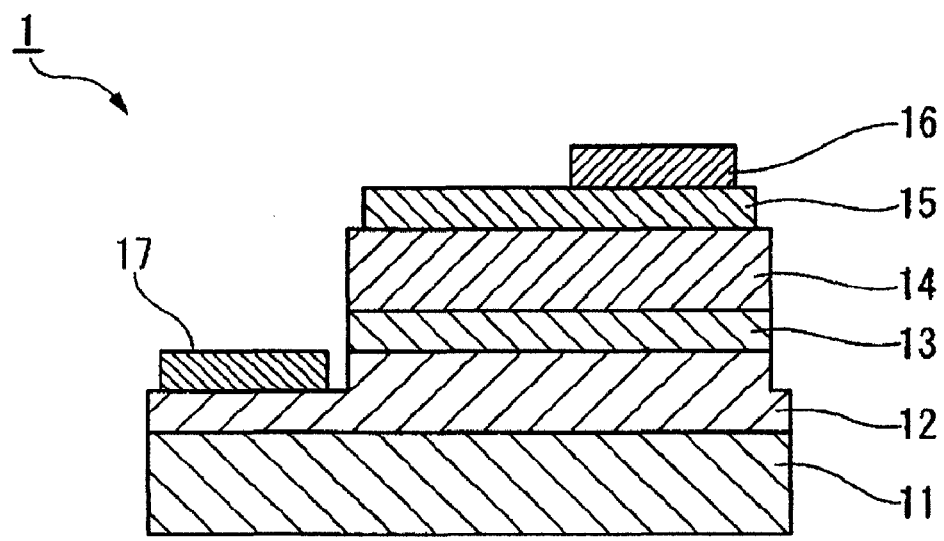
FIG. 1 is a cross-sectional view schematically illustrating an example of a gallium nitride compound semiconductor light-emitting device according to the present invention.

| [Reference Numerals] | |
|---|---|
| 1: | Gallium nitride compound semiconductor light-emitting device |
| 11, 21: | Substrate |
| 12: | N-type GaN layer (n-type semiconductor layer) |
| 13: | Light-emitting layer |
| 14: | P-type GaN layer (p-type semiconductor layer) |
| 15: | Positive electrode (translucent conductive oxide film) |
| 16: | Positive electrode bonding pad |
| 17: | Negative electrode |
| 18: | Protective layer |
| 20: | Gallium nitride compound semiconductor |
| 22: | Undoped GaN underlying layer (n-type semiconductor layer) |
| 23: | N-type GaN contact layer (n-type semiconductor layer) |
| 24: | N-type AlGaN clad layer (n-type semiconductor layer) |
| 25: | Light-emitting layer |
| 26: | P-type AlGaN clad layer (p-type semiconductor layer) |
| 27: | P-type GaN contact layer (p-type semiconductor layer) |
| 30: | Lamp |

BEST MODE FOR CARRYING OUT THE INVENTION

Hereinafter, a gallium nitride compound semiconductor light-emitting device (hereinafter, referred to as a light-emitting device), a method of manufacturing the same, and a lamp using the same according to exemplary embodiments of the present invention will be described with reference to FIGS. 1 to 5.

However, the invention is not limited to the following embodiments. For example, components of the embodiments may be appropriately combined with each other.

The method of manufacturing a gallium nitride compound semiconductor light-emitting device includes: a process of laminating a translucent conductive oxide film on a p-type semiconductor layer of a gallium nitride compound semiconductor device; and after the translucent conductive oxide film is formed on the p-type semiconductor layer, a hydrogen annealing process of performing annealing in a gas atmosphere including hydrogen ($H_2$).

FIG. 1 is a cross-sectional view schematically illustrating an example of the structure of a light-emitting device according to an embodiment of the invention.

A light-emitting device 1 shown in FIG. 1 has a schematic structure in which an n-type GaN layer 12, a light-emitting layer 13, and a p-type GaN layer (p-type semiconductor layer) 14 are laminated on a substrate 11 in this order to form a gallium nitride compound semiconductor device, a positive electrode 15 formed of a translucent conductive oxide film is laminated on the p-type GaN layer 14, a positive electrode bonding pad 16 is formed on the positive electrode 15, and a negative electrode 17 is formed in a negative electrode forming region of the n-type GaN layer 12.

In this embodiment, the positive electrode is formed by performing the hydrogen annealing process on the translucent conductive oxide film on the p-type GaN layer.

The positive electrode formed by performing the hydrogen annealing process on the translucent conductive oxide film can be used for a gallium nitride compound semiconductor light-emitting device according to the related art in which a gallium nitride compound semiconductor is laminated on a substrate with a buffer layer interposed therebetween to form an n-type semiconductor layer, a light-emitting layer, and a p-type semiconductor layer, without any restrictions.

[Structure of Gallium Nitride Compound Semiconductor Light-Emitting Device]

Hereinafter, the structure of the gallium nitride compound semiconductor light-emitting device obtained by the manufacturing method according to this embodiment will be described in detail.

(Substrate)

The substrate 11 may be formed of any known substrate materials including oxide single crystals, such as sapphire single crystal ($Al_2O_3$; an A-plane, a C-plane, an M-plane, or an R-plane), spinel single crystal ($MgAl_2O_4$), ZnO single crystal, $LiAlO_2$ single crystal, $LiGaO_2$ single crystal, or MgO single crystal, Si single crystal, SiC single crystal, GaAs single crystal, AlN single crystal, GaN single crystal, and boride single crystal, such as $ZrB_2$. This embodiment of the invention may use any substrate materials including these known substrate materials, without any restrictions.

In addition, the plane direction of the substrate is not particularly limited. As the substrate, a just substrate or an off-angle substrate may be used.

(Gallium Nitride Compound Semiconductor)

The n-type GaN layer (n-type semiconductor layer) 12, the light-emitting layer 13, and the p-type GaN layer (p-type semiconductor layer) 14 may have various known structures without any restrictions. In particular, a p-type semiconductor layer having a general carrier concentration may be used, and the translucent positive electrode 15 used in this embodiment of the invention may be applied to a p-type GaN layer having a relatively low carrier concentration of, for example, about $1\times10^{17}$ $cm^{-3}$.

As the gallium nitride compound semiconductor, semiconductors having various compositions, which are represented by a general formula $Al_xIn_yGa_{1-x-y}N$ ($0\leq x<1$, $0\leq y<1$, and $0\leq x+y<1$), have been known. In the invention, also, any of the semiconductors having various compositions, which are represented by the general formula $Al_xIn_yGa_{1-x-y}N$ ($0\leq x<1$, $0\leq y<1$, and $0\leq x+y<1$), may be used as the gallium nitride compound semiconductors forming the n-type GaN layer, the light-emitting layer, and the p-type GaN layer according to this embodiment, without any restrictions.

A method of growing the gallium nitride compound semiconductor is not particularly limited. For example, any method of growing a group-III nitride semiconductor, such as an MOCVD (metal organic chemical vapor deposition) method, an HVPE (hydride vapor phase epitaxy) method, or an MBE (molecular beam epitaxy) method, may be used to grow the gallium nitride compound semiconductor. The MOCVD method is preferable in terms of the control of the thickness of a film and mass production.

In the MOCVD method, hydrogen ($H_2$) or nitrogen ($N_2$) is used as a carrier gas, trimethylgallium (TMG) or triethylgallium (TEG) is used as a Ga source, which is a group-III element, trimethylaluminum (TMA) or triethyl aluminum (TEA) is used as an Al source, trimethylindium (TMI) or triethylindium (TEI) is used as an In source, and ammonium ($NH_3$) or hydrazine ($N_2H_4$) is used as a nitrogen (N) source, which is a group-V element. In addition, for example, Si-based materials, such as monosilane ($SiH_4$) and disilane ($Si_2H_6$), and Ge-based materials, such as germane ($GeH_4$), are used as n-type dopants, and Mg-based materials, such as bis-cyclopentadienylmagnesium ($Cp_2Mg$) and bisethylcyclopentadienyl magnesium ($EtCp_2Mg$), are used as p-type dopants.

Figure 3:
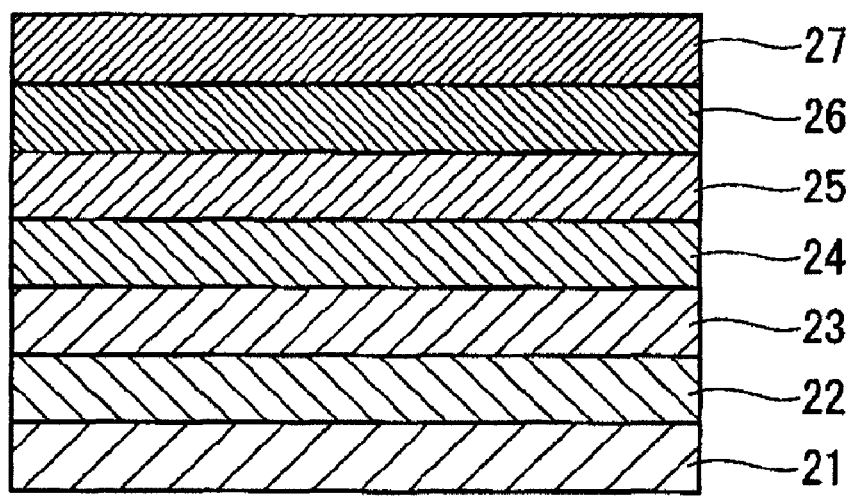
FIG. 3 is a cross-sectional view illustrating an example of a method of manufacturing the gallium nitride compound semiconductor light-emitting device according to the present invention, and shows a laminated structure of the gallium nitride compound semiconductor.

As an example of the gallium nitride compound semiconductor, a gallium nitride compound semiconductor 20 having the laminated structure shown in FIG. 3 may be used in which a buffer layer (not shown) made of AlN is formed on a substrate 21 made of sapphire, and a GaN underlying layer 22, an n-type GaN contact layer 23, an n-type AlGaN clad layer 24, a light-emitting layer 25 made of InGaN, a p-type AlGaN clad layer 26, and a p-type GaN contact layer 27 are sequentially formed on the buffer layer.

(Positive Electrode (Translucent Conductive Oxide Film))

The positive electrode 15 composed of a translucent conductive oxide film is formed on the p-type GaN layer 14. Any known thin film deposition method may be used to form the translucent conductive oxide film, without any restrictions. For example, a sputtering method or a vacuum deposition method may be used to form a thin film. However, the sputtering method is more preferable than the vacuum deposition method since it generates small particles or dust during a film deposition process.

The positive electrode according to this embodiment is obtained by forming a translucent conductive oxide film on the p-type GaN layer and performing hydrogen annealing on the film in a gas atmosphere including hydrogen. Therefore, the positive electrode has low specific resistance.

The translucent conductive oxide film may be formed of any known material. For example, the translucent conductive oxide film is preferably formed of a material having high transmittance and low specific resistance, such as ITO ($In_2O_3$—$SnO_2$), AZO (ZnO—$Al_2O_3$), IZO ($In_2O_3$—ZnO), IWO ($In_2O_3$—$WO_2$), GZO (ZnO—$Ga_2O_3$), $TiTaO_2$, or $TiNbO_2$.

In particular, ITO capable of obtaining low specific resistance is preferably used to reduce the driving voltage Vf of the light-emitting device. Since IZO or IWO has a good etching characteristic, this material makes it easy to pattern the positive electrode. When AZO or GZO is used, the specific resistance thereof is higher than that of ITO, and thus the driving voltage Vf is higher than that of the ITO. However, when AZO or GZO is formed on a GaN film, the crystallinity thereof is higher than that of ITO since ZnO contained in AZO or GZO is epitaxially grown at the grain boundaries. Therefore, the use of AZO or GZO makes it possible to form a translucent conductive oxide film that is less peeled off and has higher strength characteristics, as compared to when ITO is used. When $TiTaO_2$ or $TiNbO_2$ is used, it is possible to form a translucent conductive oxide film having high light transmittance on a GaN film since the refractive index of $TiO_2$, 2.6, is substantially equal to that of GaN.

Preferably, the translucent conductive oxide film is formed of a material having a composition with the lowest specific resistance. For example, if the translucent conductive oxide film is formed of ITO, it is preferable that the Sn concentration of ITO be in the range of 5 to 20% by mass. It is preferable to use ITO having a Sn concentration within the range of 7.5 to 12.5% by mass in order to further reduce the specific resistance.

Further, it is preferable that the thickness of the translucent conductive oxide film be in the range of 35 nm to 10000 nm (10 μm) in order to obtain low specific resistance and high transmittance. In addition, it is preferable that the thickness of the translucent conductive oxide film be less than or equal to 1000 nm (1 μm) in order to reduce manufacturing costs.

(Positive Electrode Bonding Pad and Negative Electrode)

The positive electrode bonding pad 16 is formed on the positive electrode 15 composed of the translucent conductive oxide film layer, and has various known structures made of, for example, Au, Al, Ni, and Cu. However, the material and the structure of the positive electrode bonding pad are not limited thereto.

It is preferable that the thickness of the positive electrode bonding pad 16 be in the range of 100 to 1000 nm. The bonding pad is characterized in that, as the thickness of the positive electrode bonding pad increases, the bondability thereof is improved. Therefore, it is more preferable that the thickness of the positive electrode bonding pad 16 be greater than or equal to 300 nm. In addition, it is most preferable that the thickness of the positive electrode bonding pad 16 be less than or equal to 500 nm in order to reduce manufacturing costs.

As shown in FIG. 1, the negative electrode 17 is formed so as to come into contact with the n-type GaN layer 12.

Therefore, when the negative electrode 17 is formed, the light-emitting layer 13 and the p-type GaN layer 14 are partially removed by etching to expose an n contact layer of the n-type GaN layer 12, and the negative electrode 17 is formed on the exposed n-type GaN layer.

The negative electrode 17 is formed of various materials whose compositions and structures are known, and the invention can use any of the known negative electrodes. The negative electrode may be provided by any means that is known in this technical field.

(Protective Layer)

Figure 4:
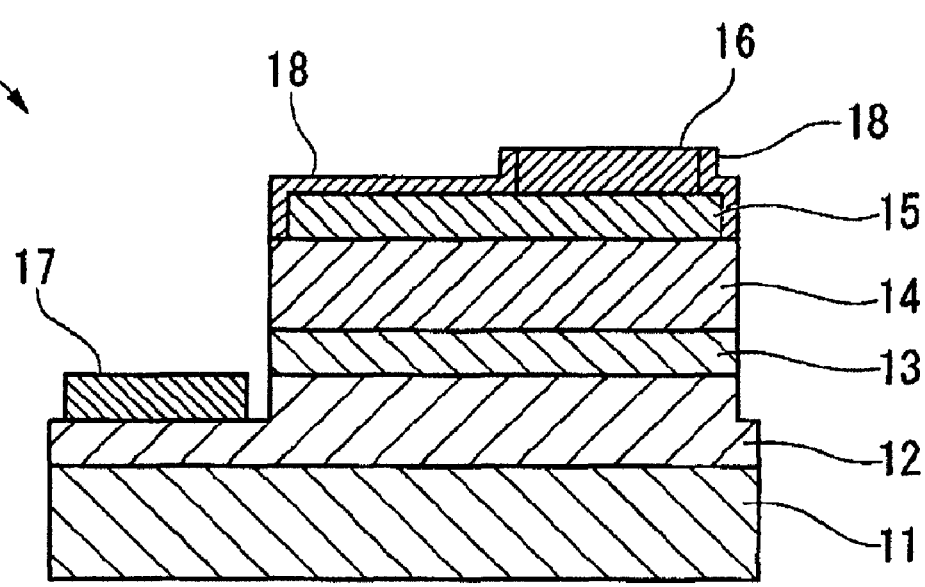
FIG. 4 is a cross-sectional view schematically illustrating another example of the gallium nitride compound semiconductor light-emitting device according to the present invention.

In this embodiment of the invention, preferably, a protective layer is formed on the translucent conductive oxide film subjected to the hydrogen annealing process, in order to prevent the translucent conductive oxide film from being oxidized, as in a light-emitting device 2 shown in FIG. 4, for example.

In FIG. 4, a protective layer 18 is formed so as to cover the positive electrode 15 composed of the translucent conductive oxide film and the outer circumference of the positive electrode bonding pad 16, but the invention is not limited thereto.

For example, the protective layer may be formed so as to further cover the side surfaces of the n-type GaN layer, the light-emitting layer, and the p-type GaN layer.

The protective layer is preferably formed of a material having high transmittance since it covers the entire surface of the translucent conductive oxide film. When the protective layer is formed so as to cover the side surfaces of the n-type GaN layer, the light-emitting layer, and the p-type GaN layer, the protective layer is preferably formed of an insulating material, such as $SiO_2$ or $Al_2O_3$, in order to prevent current leakage between the p-type GaN layer and the n-type GaN layer.

The protective layer may have a sufficient thickness to prevent the translucent conductive oxide film from being oxidized and to ensure high transmittance. For example, the thickness of the protective layer is preferably in the range of 20 nm to 500 nm.

[Method of Manufacturing Gallium Nitride Compound Semiconductor Light-Emitting Device]

As described above, the method of manufacturing a gallium nitride compound semiconductor light-emitting device includes: a process of laminating a translucent conductive oxide film on a p-type semiconductor layer of a gallium nitride compound semiconductor device; and after the translucent conductive oxide film is formed on the p-type semiconductor layer, a hydrogen annealing process of performing annealing in a gas atmosphere including hydrogen ($H_2$).

The manufacturing method according to this embodiment of the invention may include the following processes (a) to (c):

(a) a process of forming a translucent conductive oxide film on the entire surface of the p-type semiconductor layer;

(b) a hydrogen annealing process of annealing the translucent conductive oxide film in a gas atmosphere including hydrogen; and (c) an etching process of etching the translucent conductive oxide film to pattern the translucent conductive oxide film.

In addition, the manufacturing method according to this embodiment of the invention may include the following processes (d) to (f):

(d) a process of forming a translucent conductive oxide film on the entire surface of the p-type semiconductor layer;

(e) an etching process of etching the translucent conductive oxide film to pattern the translucent conductive oxide film; and (f) a hydrogen annealing process of annealing the translucent conductive oxide film in a gas atmosphere including hydrogen.

As described in the processes (a) to (c) and the processes (d) to (f), in the manufacturing method according to this embodiment of the invention, the hydrogen annealing process (the processes (b) and (f)) of performing hydrogen annealing on the translucent conductive oxide film formed by the film forming process (the processes (a) and (d)), and the etching process (the processes (c) and (e)) of etching the translucent conductive oxide film may be reversed in order.

Hereinafter, the above-mentioned processes will be described in detail.

(Film Forming Process)

In the film forming process, the translucent conductive oxide film is formed so as to cover the entire surface of the p-type GaN layer.

When the hydrogen annealing process is performed with a large area of the upper surface of the p-type GaN layer being opened, hydrogen is infiltrated into the p-type GaN layer, and the specific resistance of the p-type GaN layer is increased.

However, since the translucent conductive oxide film is formed so as to cover the entire surface of the p-type GaN layer, no hydrogen is infiltrated into the p-type GaN layer. As a result, it is possible to prevent a reduction in the specific resistance.

Figure 2:
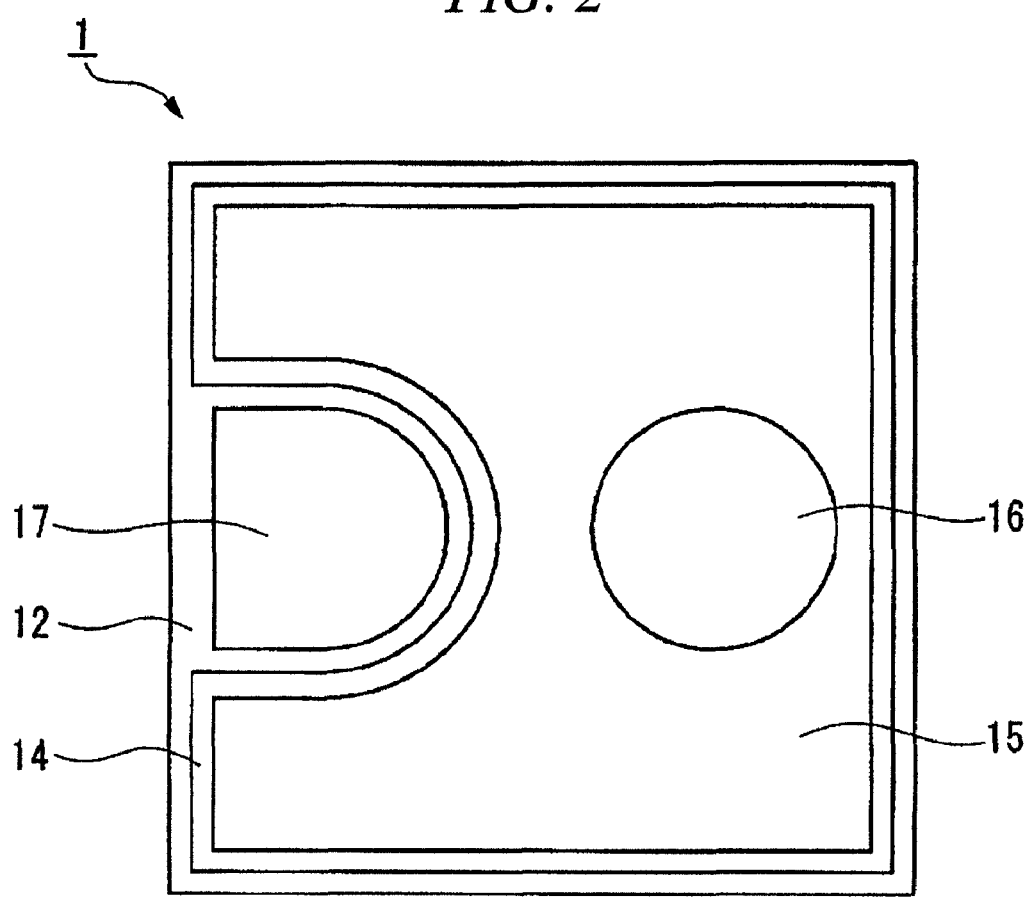
FIG. 2 is a plan view schematically illustrating an example of the gallium nitride compound semiconductor light-emitting device according to the present invention.

In the structure shown in FIGS. 1 and 2, after the hydrogen annealing process, the translucent conductive oxide film (positive electrode 15) is etched such that the edge of the p-type GaN layer 14 is exposed.

(Hydrogen Annealing Process)

After the translucent conductive oxide film is formed on the p-type GaN layer, the hydrogen annealing process is performed.

In this case, it is preferable that the hydrogen annealing process be performed at a temperature in the range of 300 to 900° C. However, the process time of the hydrogen annealing depends on the temperature of the annealing process. It is to be noted that, as the process time of the hydrogen annealing is lengthened, the transmittance of the translucent conductive oxide film is lowered. For example, it is preferable that the hydrogen annealing be performed at a temperature of 600° C. for one to two minutes.

It is preferable that hydrogen concentration in the gas atmosphere be in the range of 0.1 to 5% by volume in the hydrogen annealing process. The hydrogen concentration in the gas atmosphere may be lower than the above range. For example, the hydrogen annealing may be performed in a gas atmosphere containing $H_2$ and $N_2$ at a volume ratio of 1:99. When the hydrogen annealing is performed in the gas atmosphere containing hydrogen in the above concentration range, it is possible to obtain the translucent conductive oxide film having sufficiently low specific resistance.

In this embodiment of the invention, as shown in the following Table 1, when the hydrogen annealing is performed on the translucent conductive oxide film, it is possible to reduce the specific resistance of the translucent conductive oxide film, as compared to when the annealing process is performed in a nitrogen ($N_2$) atmosphere including no hydrogen ($H_2$). When the annealing process is performed on the translucent conductive oxide film in a gas atmosphere including hydrogen, hydrogen is attracted to the p-type GaN layer, and then bonded to acceptors, such as Mg or Zn, in the p-type GaN layer. As a result, there is a concern that the specific resistance of the p-type GaN layer will be increased.

Therefore, in this embodiment of the invention, after the translucent conductive oxide film is formed on the entire surface of the p-type GaN layer, the hydrogen annealing is performed without the surface p-type GaN layer being exposed in the gas atmosphere including hydrogen, which makes it possible to prevent the infiltration of hydrogen into the p-type GaN layer and the bonding between hydrogen atoms and acceptors, such as Mg or Zn. As a result, it is possible to prevent an increase in specific resistance. In this way, it is possible to reduce the driving voltage Vf of the light-emitting device.

TABLE 1

| Translucent conductive oxide film | Annealing | Specific resistance/$\Omega \cdot cm$ |
| --- | --- | --- |
| ITO | Not executed | $2.5 \times 10^{-3}$ |
| ITO | $N_2$ atmosphere | $5.0 \times 10^{-4}$ |
| ITO | $H_2$ atmosphere | $2.5 \times 10^{-4}$ |

(Etching Process)

Next, the etching process will be described.

After the hydrogen annealing process, etching is performed on the translucent conductive oxide film to pattern the electrode 15 as shown in FIG. 2. In many cases, the crystallinity of the translucent conductive oxide film is improved by the hydrogen annealing. Therefore, it may be difficult to perform a known wet etching method on the translucent conductive oxide film. In this case, it is preferable to etch the translucent conductive oxide film using a dry etching apparatus.

In this embodiment of the invention, it is preferable that, after the translucent conductive oxide film is formed, the etching process and the hydrogen annealing process be sequentially performed.

The crystallinity of the translucent conductive oxide film is improved by the hydrogen annealing process. However, in this case, since it is difficult to perform etching, the etching time is lengthened. Therefore, before the hydrogen annealing process, etching is performed on the translucent conductive oxide film having low crystallinity to shorten the time required for the etching process. In this case, the etching process reduces the thickness of the translucent conductive oxide film and exposes a portion of the translucent conductive oxide film such that a portion of the p-type GaN layer is exposed. As a result, hydrogen is more likely to be infiltrated into the p-type GaN layer.

In this embodiment of the invention, when the hydrogen annealing process is performed after the etching process, it is preferable that the annealing process be performed at a temperature in the range of 600 to 900° C. When the annealing temperature is lower than or equal to 600° C., hydrogen is less likely to be infiltrated into the p-type GaN layer. Therefore, it is possible to prevent an increase in the specific resistance of the p-type GaN layer.

(Oxygen Annealing Process)

In this embodiment of the invention, in order to further improve the transmittance of the translucent conductive oxide film, it is preferable to perform an oxygen annealing process as a pre-process of the hydrogen annealing at a temperature in the range of 200° C. to 300° C. in a gas atmosphere including oxygen ($O_2$) (for example, in an air atmosphere).

The oxygen annealing process may be performed between the process of forming the translucent conductive oxide film and the hydrogen annealing process. Similar to the hydrogen annealing process, the oxygen annealing process makes it difficult to pattern the oxide film using wet etching. Therefore, it is preferable to pattern the oxide film using dry etching.

As described above, after the positive electrode composed of the translucent conductive oxide film is formed on the p-type GaN layer, the p-type GaN layer 14, the light-emitting layer 13, and the n-type GaN layer 12 are partially removed by etching to expose the n-type GaN layer 12, as shown in FIG. 1. Then, the negative electrode 17 is provided on the n-type GaN layer 12. In addition, the positive electrode bonding pad 16 is provided on the translucent conductive oxide film, serving as the positive electrode 15, thereby obtaining the light-emitting device 1 shown in FIG. 1.

(Formation of Protective Layer)

In this embodiment of the invention, as described above, the hydrogen annealing process is performed on the translucent conductive oxide film and the positive electrode bonding pad and the negative electrode are formed. Then, preferably, a protective layer is formed on the positive electrode 15 in order to prevent the translucent conductive oxide film from being oxidized, as in the light-emitting device 2 shown in FIG. 4.

In the light-emitting device 2 shown in FIG. 4, the protective layer 18 is formed so as to cover the positive electrode 15 and the outer circumference of the positive electrode bonding pad 16, but the invention is not limited thereto. For example, the protective layer may be formed so as to cover the side surface of each of the n-type GaN layer, the light-emitting layer, and the p-type GaN layer.

As described above, the gallium nitride compound semiconductor light-emitting device according to this embodiment of the invention is manufactured by the above-mentioned manufacturing method. Therefore, it is possible to obtain a translucent conductive oxide film having low specific resistance and prevent an increase in the specific resistance of the p-type GaN layer. As a result, it is possible to obtain a gallium nitride compound semiconductor light-emitting device having a low driving voltage Vf.

[Structure of Lamp]

For example, a known means may be used to mount a transparent cover to the gallium nitride compound semiconductor light-emitting device according to this embodiment of the present invention, thereby forming a lamp. In addition, it is possible to form a white lamp by combining the gallium nitride compound semiconductor light-emitting device according to this embodiment with a cover including a phosphor.

Figure 5:
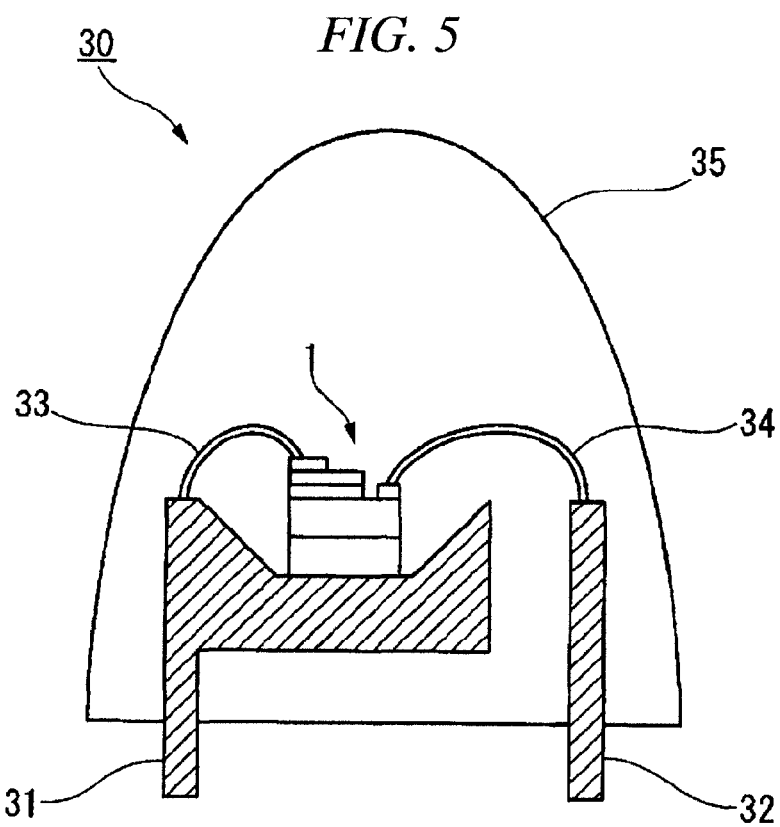
FIG. 5 is a cross-sectional view schematically illustrating a lamp including the gallium nitride compound semiconductor light-emitting device according to the present invention.

As shown in FIG. 5, for example, the gallium nitride compound semiconductor light-emitting device according to this embodiment may be used to form an LED lamp by a known method. The gallium nitride compound semiconductor light-emitting device may be used for various types of lamps, such as a general-purpose bomb-shaped lamp, a side view lamp for a backlight of a mobile phone, and a top view lamp used for a display device.

For example, when a face-up gallium nitride compound semiconductor light-emitting device is mounted on the bomb-shaped lamp, as shown in FIG. 5, the gallium nitride compound semiconductor light-emitting device 1 is adhered to one of two frames 31 and 32 by, for example, resin, and the positive electrode bonding pad and the negative electrode bonding pad are bonded to the frames 31 and 32 by wires 33 and 34 formed of, for example, gold, respectively. Then, the periphery of the device is molded by a transparent resin (see a mold 35 in FIG. 5), thereby manufacturing a bomb-shaped lamp 30.

The lamp according to this embodiment of the present invention can have high emission efficiency since it is provided with the gallium nitride compound semiconductor light-emitting device.

EXAMPLES

Next, the gallium nitride compound semiconductor light-emitting device, the method of manufacturing the gallium nitride compound semiconductor light-emitting device, and the lamp according to the present invention will be described in detail with reference to Examples, but the present invention is not limited thereto.

Example 1

FIG. 3 is a cross-sectional view schematically illustrating an epitaxial structure used for the gallium nitride compound semiconductor light-emitting device according to Examples of the invention. FIGS. 1 and 2 are respectively a cross-sectional view and a plan view schematically illustrating the gallium nitride compound semiconductor light-emitting device according to the present invention. Next, the gallium nitride compound semiconductor light-emitting device will be described with reference to FIGS. 1 to 3.

(Manufacture of Gallium Nitride Compound Semiconductor Light-Emitting Device)

The laminated structure of the gallium nitride compound semiconductor 20 shown in FIG. 3 was formed by sequentially laminating, on a c-plane ((0001) crystal surface) sapphire substrate 21, an undoped GaN underlying layer (thickness=2 μm) 22, a Si-doped n-type GaN contact layer (thickness=2 μm, and carrier concentration=$1 \times 10^{19}$ cm$^{-3}$) 23, a Si-doped n-type $Al_{0.07}Ga_{0.93}N$ clad layer (thickness=12.5 nm, and carrier concentration=$1 \times 10^{18}$ cm$^{-3}$) 24, a light-emitting layer 25 having a multiple quantum structure of 6 Si-doped GaN barrier layers (thickness=14.0 nm, and carrier concentration=$1 \times 10^{18}$ cm$^{-3}$) and 5 undoped $In_{0.20}Ga_{0.80}N$ well layers (thickness=2.5 nm), a Mg-doped p-type $Al_{0.07}Ga_{0.93}N$ clad layer (thickness=10 nm) 26, and a Mg-doped p-type GaN contact layer (thickness=100 nm) 27, with a buffer layer (not shown) formed of AlN interposed therebetween. The layers 22 to 27 of the laminated structure of the gallium nitride compound semiconductor 20 were grown by a general low pressure MOCVD device.

The epitaxial structure of the gallium nitride compound semiconductor 20 was used to manufacture a gallium nitride compound semiconductor light-emitting device (see FIG. 1). First, HF and HCl were used to clean the surface of the p-type GaN contact layer 27, and a translucent conductive oxide film layer made of ITO was formed on the p-type GaN contact layer 27 by a sputtering method. The ITO film was formed with a thickness of about 250 nm by a DC magnetron sputter. In the sputter, an ITO target having 10% by mass of $SnO_2$ was used, and the ITO film was formed at a pressure of about 0.3 Pa.

After the translucent conductive oxide film made of ITO was formed, it was subjected to the hydrogen ($H_2$) annealing process at a temperature in the range of 200° C. to 900° C. in an RTA furnace. In this case, the hydrogen annealing process was performed in a $N_2$ atmosphere including 1% by volume of $H_2$. Then, known photolithography and etching were performed such that ITO remained on only a region for forming a positive electrode on the p-type GaN contact layer 27. In this way, the positive electrode (see reference numeral 15 in FIGS. 1 and 2) according to the invention was formed on the p-type GaN contact layer 27.

The positive electrode formed by the above-mentioned method had high transmittance, for example, a transmittance of 90% or more in a wavelength range of 460 nm. The transmittance was measured by a spectrophotometer using a sample for measuring transmittance in which a translucent conductive oxide film layer having the same thickness as described above was laminated on a glass plate. In addition, the transmittance value was calculated in consideration of a transmittance value measured from only the glass plate.

(Formation of Positive Electrode Bonding Pad and Negative Electrode)

Next, general dry etching was performed in a region for forming an n-type electrode (negative electrode) to expose the Si-doped n-type GaN contact layer (see FIG. 1) only in the region. Then, a first layer (thickness=40 nm) made of Cr, a second layer (thickness=100 nm) made of Ti, and a third layer (thickness=400 nm) made of Au were sequentially formed on a portion of the translucent conductive oxide film layer (positive electrode) 15 and the Si-doped n-type GaN contact layer 23 by a vacuum deposition method, thereby forming the positive electrode bonding pad 16 and the negative electrode 17.

(Division of Light-Emitting Device)

After forming the positive electrode bonding pad 16 and the negative electrode 17, the rear surface of the substrate 11 formed of sapphire was polished into a mirror surface by polishing particles, such as diamond particles. Then, the laminated structure was cut into individual square chips each having a 350 μm square, and the chip was mounted to the lead frame, and then connected to the lead frame by a gold (Au) wire.

(Measurement of Driving Voltage Vf and Emission Power Po)

A probe was placed in contact with the chip and a current of 20 mA was applied to the chip to measure a forward voltage (driving voltage: Vf). In addition, the emission power Po was measured by a general integrating sphere. It was found that light was emitted from the entire surface of the positive electrode 15.

The driving voltage Vf of the light-emitting device measured as described above is shown in the graph of FIG. 6 in which the horizontal axis indicates a hydrogen annealing temperature.

The emission power Po was 10 mW regardless of the hydrogen annealing temperature.

The characteristics of the light-emitting device according to Example 1 are shown in Table 2.

Figure 6:
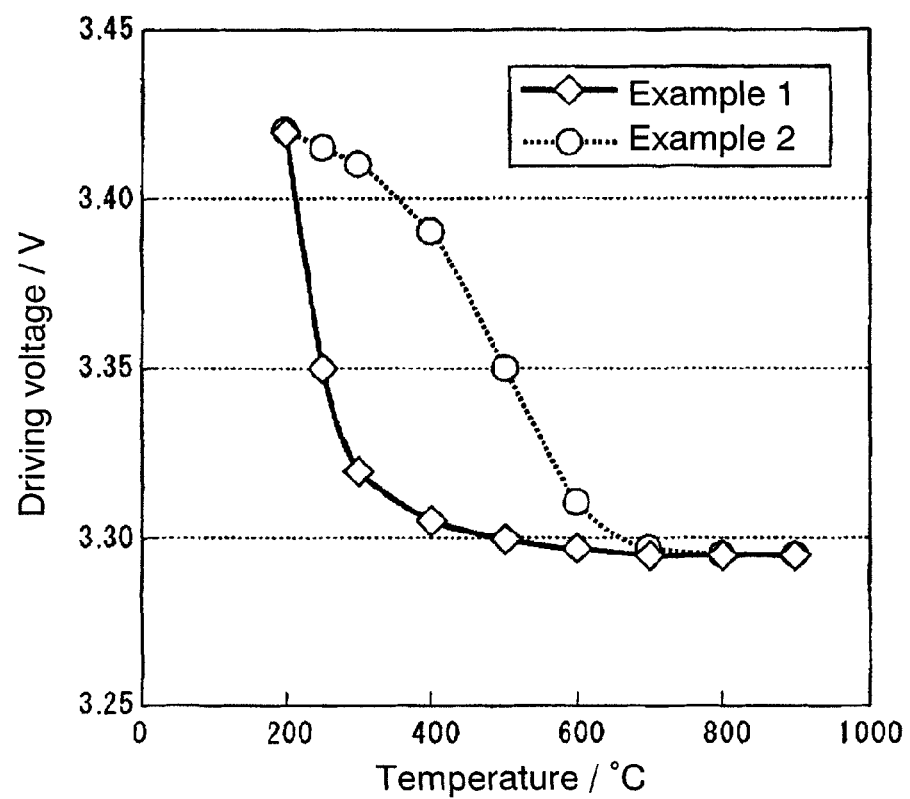
FIG. 6 is a diagram illustrating the gallium nitride compound semiconductor light-emitting device according to the present invention, and is a graph illustrating the relationship between a driving voltage Vf and the temperature of a hydrogen annealing process according to Examples.

As can be seen from the graph of FIG. 6, when the hydrogen annealing process is performed at a temperature of more than 300° C., the driving voltage Vf of the light-emitting device is decreased. When the hydrogen annealing process is performed at a temperature of less than 300° C., the driving voltage Vf of the light-emitting device is increased.

When the hydrogen annealing process is performed on ITO at a temperature of 200° C., the ITO film has a relatively high resistance of $4\times10^{-4}$ Ωcm. Therefore, as shown in FIG. 6, when the hydrogen annealing process is performed at a temperature of less than 300° C., the driving voltage Vf is increased, since the specific resistance of the ITO film is not sufficiently reduced.

Example 2

A gallium nitride compound semiconductor light-emitting device was manufactured, similar to Example 1, except that wet etching was performed on an ITO film and then the hydrogen annealing process was performed thereon.

The driving voltage Vf of the light-emitting device according to Example 2 is shown in the graph of FIG. 6.

The emission power Po of the light-emitting device according to Example 2 was 10 mW.

In Example 2 in which wet etching is performed on the ITO film and then the hydrogen annealing process is performed thereon, as the temperature is increased, the driving voltage Vf is decreased. However, unlike Example 1, a rapid reduction in the driving voltage Vf at a temperature of about 300° C. does not occur. It is considered that this is because the p-type GaN layer is exposed in a $H_2$ atmosphere and $H_2$ atoms are attracted to the p-type GaN layer. However, the driving voltage Vf is reduced to the same level as that in Example 1 at a temperature of more than 600° C. It is considered that this is because the attraction of $H_2$ atoms to the p-type GaN layer is prevented at a temperature of more than 600° C.

Example 3

A gallium nitride compound semiconductor light-emitting device was manufactured, similar to Example 1, except that, before the hydrogen annealing process was performed at a temperature of 600° C., an oxygen annealing process was performed in a gas atmosphere including oxygen at a temperature of 250° C. for one minute.

The ITO film subjected to the oxygen annealing process had a transmittance that was 3 to 5% higher than that of an ITO film not subjected to the oxygen annealing process in a wavelength range of 460 nm. In addition, when the oxygen annealing process was performed, the emission power Po was 11 mW, which was 1 mW higher than that when the oxygen annealing process was not performed (Example 1).

Annealing conditions and device characteristics of Example 3 are shown in Table 2 together with data of Example 1.

TABLE 2

|  | $O_2$ annealing | $H_2$ annealing | Vf/V | Po/mW |
| --- | --- | --- | --- | --- |
| Example 1 | Not executed | 600° C. | 3.3 | 10 |
| Example 3 | 250° C. | 600° C. | 3.3 | 11 |

Example 4

A gallium nitride compound semiconductor light-emitting device was manufactured, similar to Example 3, except that a protective layer made of $SiO_2$ was formed with a thickness of 100 nm in a region other than the positive electrode bonding pad and the negative electrode.

The light-emitting device according to Example 4 emitted light for 100 hours and then the output deterioration thereof was measured. As a result, the output deterioration was less than that when the protective layer was not formed. It is considered that the formation of the protective layer makes it possible to prevent an increase in the specific resistance of an ITO film due to $O_2$ atoms in the air.

The Examples proved that the gallium nitride compound semiconductor light-emitting device according to the present invention had a low driving voltage Vf and high device characteristics.

INDUSTRIAL APPLICABILITY

The present invention can be applied to a method of manufacturing a gallium nitride compound semiconductor light-emitting device, particularly, to a gallium nitride compound semiconductor light-emitting device having a low driving voltage Vf, a method of manufacturing a gallium nitride compound semiconductor light-emitting device, and a lamp using the same.

The invention claimed is:

1. A method of manufacturing a gallium nitride compound semiconductor light-emitting device in which a translucent conductive oxide film is formed on an entire surface of a p-type semiconductor layer of a gallium nitride compound semiconductor device, the method comprising:

after forming the translucent conductive oxide film on the entire surface of the p-type semiconductor layer, annealing the translucent conductive oxide film in a gas atmosphere including 0.1 to 5% by volume of hydrogen ($H_2$), wherein the translucent conductive oxide film has specific resistance of $2.5\times10^{-4}$ Ω·cm or less.

2. The method of manufacturing a gallium nitride compound semiconductor light-emitting device according to claim 1, further comprising:

etching the translucent conductive oxide film to pattern the translucent conductive oxide film after the hydrogen annealing process.

3. The method of manufacturing a gallium nitride compound semiconductor light-emitting device according to claim 1,
wherein the hydrogen annealing process is performed at a temperature in the range of 300° C. to 900° C.

4. The method of manufacturing a gallium nitride compound semiconductor light-emitting device according to claim 1, further comprising:
before the hydrogen annealing process, annealing at a temperature in the range of 200° C. to 300° C. in a gas atmosphere including oxygen ($O_2$).

5. The method of manufacturing a gallium nitride compound semiconductor light-emitting device according to claim 1,
wherein, after the hydrogen annealing process, forming a protective layer on the translucent conductive oxide film.

6. A gallium nitride compound semiconductor light-emitting device manufactured by the method according to claim 1.

7. The method of manufacturing a gallium nitride compound semiconductor light-emitting device according to claim 1, further comprising:
etching the translucent conductive oxide film to pattern the translucent conductive oxide film before the hydrogen annealing process.

8. The method of manufacturing a gallium nitride compound semiconductor light-emitting device according to claim 7,
wherein the hydrogen annealing process is performed at a temperature in the range of 600° C. to 900° C.

9. A gallium nitride compound semiconductor light-emitting device comprising:
a gallium nitride compound semiconductor device including a p-type semiconductor layer; and
a translucent conductive oxide film that is formed on an entire surface of the p-type semiconductor layer,
wherein an annealing process is performed on the translucent conductive oxide film in a gas atmosphere including 0.1 to 5% by volume of hydrogen ($H_2$), and
the translucent conductive oxide film has specific resistance of $2.5 \times 10^{-4}$ Ω·cm or less.

10. The gallium nitride compound semiconductor light-emitting device according to claim 9,
wherein the thickness of the translucent conductive oxide film is in the range of 35 nm to 10 μm.

11. The gallium nitride compound semiconductor light-emitting device according to claim 9,
wherein the thickness of the translucent conductive oxide film is in the range of 100 nm to 1 μm.

12. A lamp comprising the gallium nitride compound semiconductor light-emitting device according to claim 9.

13. The gallium nitride compound semiconductor light-emitting device according to claim 9,
wherein the translucent conductive oxide film is formed of at least one of ITO ($In_2O_3$—$SnO_2$), IZO ($In_2O_3$—ZnO), IWO ($In_2O_3$—$WO_2$), GZO (ZnO—$Ga_2O_3$), ZnO, and $TiO_2$.

14. The gallium nitride compound semiconductor light-emitting device according to claim 13,
wherein the translucent conductive oxide film includes at least ITO.

15. The gallium nitride compound semiconductor light-emitting device according to claim 9,
wherein a protective layer is formed on the translucent conductive oxide film.

16. The gallium nitride compound semiconductor light-emitting device according to claim 15,
wherein the thickness of the protective layer is in the range of 20 nm to 500 nm.

* * * * *